United States Patent [19]
Sakuratani et al.

[11] Patent Number: 5,865,920
[45] Date of Patent: Feb. 2, 1999

[54] METHOD OF FORMING ELECTRODE ON CERAMIC GREEN SHEET AND METHOD OF MANUFACTURING MULTILAYER CERAMIC ELECTRONIC COMPONENT

[75] Inventors: Masahiro Sakuratani, Takefu; Isao Kaizaki, Fukui, both of Japan

[73] Assignee: Murata Manufacturing Co., Ltd., Japan

[21] Appl. No.: 921,745

[22] Filed: Aug. 11, 1997

Related U.S. Application Data

[63] Continuation of Ser. No. 520,607, Aug. 30, 1995, abandoned.

[30] Foreign Application Priority Data

Aug. 31, 1994 [JP] Japan .................................. 6-207653

[51] Int. Cl.⁶ .................................................. B32B 31/26
[52] U.S. Cl. .................. 156/89.16; 156/246; 156/247; 156/249; 156/289; 29/851; 427/96
[58] Field of Search ........................... 156/89.12, 89.16, 156/246, 247, 249, 289; 264/614, 615, 618, 619; 427/96, 97, 99, 126.2, 126.3, 123, 124; 29/846, 851

[56] References Cited

U.S. PATENT DOCUMENTS

| | | |
|---|---|---|
| 4,301,580 | 11/1981 | Wallace . |
| 4,985,098 | 1/1991 | Kohno et al. ...................... 427/79 X |
| 5,101,319 | 3/1992 | Diffeyes et al. . |
| 5,292,548 | 3/1994 | Rainwater ............................. 427/97 |
| 5,480,503 | 1/1996 | Casey et al. ........................... 156/89 |
| 5,534,290 | 7/1996 | Rainwater et al. .................... 427/97 |

*Primary Examiner*—Curtis Mayes
*Attorney, Agent, or Firm*—Ostrolenk, Faber, Gerb & Soffen, LLP

[57] ABSTRACT

In a method of forming an electrode on a ceramic green sheet, an electrode is formed on a support film by a thin film forming method, an adhesion inhibitor is formed on top of the electrode for protecting the same from adhesion of a ceramic slurry, and thereafter a ceramic slurry is applied onto the support film to form a ceramic green sheet, thereby obtaining a ceramic green sheet, provided with a through electrode.

20 Claims, 4 Drawing Sheets

METHOD OF FORMING ELECTRODE ON CERAMIC GREEN SHEET AND METHOD OF MANUFACTURING MULTILAYER CERAMIC ELECTRONIC COMPONENT

This is a Continuation of application Ser. No. 08/520,607 filed on Aug. 30, 1995, now abandoned.

BACKGROUND OF THE INVENTION

1. Field of the Invention

The present invention relates to a method of forming an electrode on a ceramic green sheet and a method of manufacturing a multilayer ceramic electronic component, and more particularly, it relates to a method of forming an electrode such as a via hole electrode or a through hole electrode passing through a ceramic layer, and a method of manufacturing a multilayer ceramic electronic component having such a through electrode.

2. Description of the Background Art

A multilayer ceramic electronic component or a ceramic multilayer substrate having electronic component elements in its interior is provided with via hole electrodes or through hole electrodes passing through ceramic layers for connecting electrodes which are formed at different vertical positions in a ceramic sintered body FIG. 1 shows an exemplary multilayer ceramic electronic component 1 having such through electrodes.

The multilayer ceramic electronic component 1 shown in FIG. 1 has a sintered body 2 which is prepared by stacking a plurality of ceramic green sheets with each other and firing the obtained laminate. In this sintered body 2, internal electrodes 3 to 6 are formed at different vertical positions. The internal electrodes 3 and 4 are electrically connected with each other by a via hole electrode 7, while the internal electrodes 5 and 6 are also electrically connected with each other by another via hole electrode 8. External electrodes 9 and 10 are formed on both end surfaces of the sintered body 2 respectively.

In order to obtain the ceramic sintered body 2, in general, ceramic green sheets which are provided with the internal electrodes 3 to 6 on single major surfaces thereof respectively and blank ceramic sheets are stacked with each other to obtain a laminate. The ceramic green sheet which is provided with the internal electrode 3 on its upper surface is formed with a through hole, and this through hole is filled up with a conductive material to form the aforementioned via hole electrode 7. Similarly, the ceramic green sheet which is provided with the internal electrode 5 on its upper surface is formed with a through hole, and this through hole is filled up with a conductive material to form the via hole electrode 8.

The laminate obtained in the aforementioned manner is pressurized along its thickness, and thereafter fired at a prescribed temperature, to obtain the sintered body 2.

The ceramic green sheet for forming the via hole electrode 7 is prepared by the following method (see FIG. 2: First, a ceramic green sheet 12 is formed on a support film 11 consisting of synthetic resin such as polyethylene terephthalate by a doctor blade coater, for example, as shown in FIG. 2. Then, the ceramic green sheet 12 is punched with the support film 11, so that through holes 11a and 12a are formed therein. Thereafter the through holes 11a and 12a are filled up with conductive paste 13, and another conductive paste layer 14 is printed to define the internal electrode 3. In order to obtain the laminate, the ceramic green sheet 12 is separated from the support film 11, to be stacked with other ceramic green sheets.

In the conventional method, as hereinabove described, each of the via hole electrodes 7 and 8 must be formed through the complicated steps described with reference to FIG. 2. In other words, it is necessary to form a ceramic green sheet on a carrier film, then correctly form a through hole in a position for forming a via hole electrode, and thereafter fill up the through hole with a conductive material through complicated operations.

SUMMARY OF THE INVENTION

An object of the present invention is to provide a method of forming an electrode on a ceramic green sheet through which a ceramic green sheet having a through electrode such as a via hole electrode or a through hole electrode can be readily obtained, and a method of manufacturing a multilayer ceramic electronic component having such through electrodes.

According to a first aspect of the present invention, provided is a method of forming an electrode on a ceramic green sheet comprising the steps of applying an electrode material onto a support for forming an electrode, forming an adhesion inhibitor on the electrode for preventing adhesion of a ceramic slurry to the electrode, and applying a ceramic slurry onto the support for forming a ceramic green sheet on a region around the electrode, thereby obtaining a ceramic green sheet provided with a through electrode passing through the same.

Namely, an electrode is formed on a support and the aforementioned adhesion inhibitor is thereafter formed on the electrode, and then a ceramic slurry is applied to form a ceramic green sheet. Under these circumstances, the ceramic slurry will not adhere to the electrode due to the adhesion inhibitor which is formed on the electrode. Thus, the ceramic green sheet provided with a through electrode is formed on the support as described above.

The adhesion inhibitor for preventing adhesion of the ceramic slurry is prepared from a proper material which can repel or enable the supplied ceramic slurry to be readily removed during execution of the method of forming the ceramic green sheet such as the doctor blade method or a curtain coater method. This material is prepared from paraffin or silicon oil when the ceramic slurry contains water as a solvent, for example. When the ceramic slurry contains an alcoholic solvent, on the other hand, the material is prepared from silicon oil or fluororesin, for example. In any case, a proper material is selected which has absolutely no compatibility with the ceramic slurry and scatters when firing the ceramics. The type of this material cannot be unequivocally set since the same varies with the type of the ceramic slurry.

The electrode can be initially formed on the support either by a thin film forming method such as vapor deposition, ion plating, sputtering by paste. However, the electrode plating, or a proper method such as printing of conductive is preferably formed by the thin film forming method since the conductive paste may disadvantageously be dissolved in the adhesion inhibitor.

While the feature of the present invention resides in that the adhesion inhibitor is formed on the electrode for preventing the adhesion of the ceramic slurry, this adhesion inhibitor may not necessarily be formed on the overall surface of the electrode. For example, electrodes having different thicknesses may be provided with no adhesion inhibitor formed on the electrode having a smaller thickness, in order to form a second electrode which is arranged within the ceramic green sheet along with the through electrode, as will be clearly understood from an embodiment of the present invention to be described later.

According to a second aspect of the present invention, a method of manufacturing a multilayer ceramic electronic component comprises the steps of applying an electrode material onto a support for forming an electrode, forming an adhesion inhibitor on the electrode for preventing adhesion of a ceramic slurry to the electrode, applying a ceramic slurry onto the support for forming a ceramic green sheet in a region around the electrode, thereby obtaining a ceramic green sheet provided with a through electrode passing through the same, stacking at least one such ceramic green sheet provided with a through electrode with another ceramic green sheet for obtaining a ceramic laminate, and firing the ceramic laminate.

The steps of obtaining the laminate and firing the laminate to obtain a sintered body can be carried out in accordance with a well-known method of manufacturing a multilayer ceramic electronic component.

According to the first aspect of the present invention, the adhesion inhibitor is formed on the electrode which is formed on the support so that the ceramic slurry is repelled by or removed from the adhesion inhibitor during formation of the ceramic green sheet, whereby the ceramic slurry is applied to the region around the electrode. Thus, no ceramic slurry adheres onto the electrode, whereby a ceramic green sheet provided with a through electrode can be readily obtained.

According to the second aspect of the present invention, on the other hand, a multilayer ceramic electronic component can be provided including the ceramic green sheet provided with a through electrode which is prepared through a relatively small number of steps as described above.

According to the present invention, therefore, it is possible to supply a multilayer ceramic electronic component having through electrodes such as through hole electrodes or via hole electrodes through a relatively small number of steps at a low cost.

The present invention is widely applicable to a method of manufacturing a multilayer ceramic electronic component having via hole electrodes or through hole electrodes, such as a ceramic multilayer substrate, a capacitor or an inductor which is integrated with other elements.

The foregoing and other objects, features, aspects and advantages of the present invention will become more apparent from the following detailed description of embodiments of the present invention when taken in conjunction with the accompanying figures.

DESCRIPTION OF THE PREFERRED EMBODIMENTS

An embodiment of the present invention is now described with reference to the drawings, to clarify the present invention.

Figure 1:
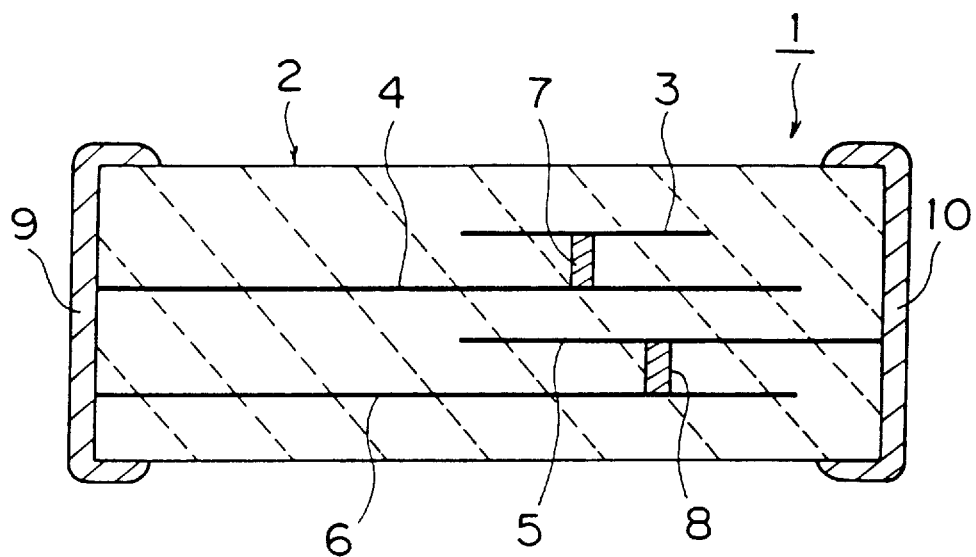
FIG. 1 is a sectional view showing an exemplary conventional multilayer ceramic electronic component.
Figure 2:
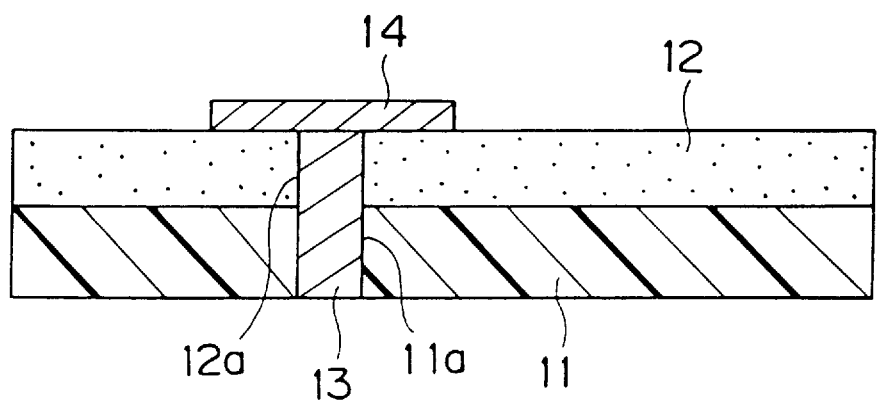
FIG. 2 is a sectional view for illustrating steps of forming a via hole electrode in a conventional method.
Figure 3:
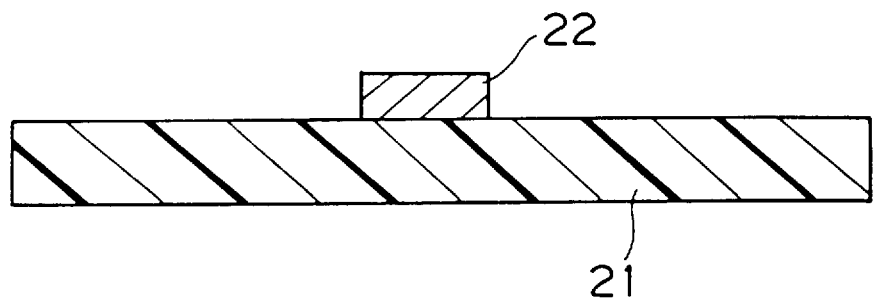
FIGS. 3(a) and 3(b) are sectional views showing a support film which is provided thereon with an electrode and an adhesion inhibitor which is formed on the electrode respectively.
Figure 3:
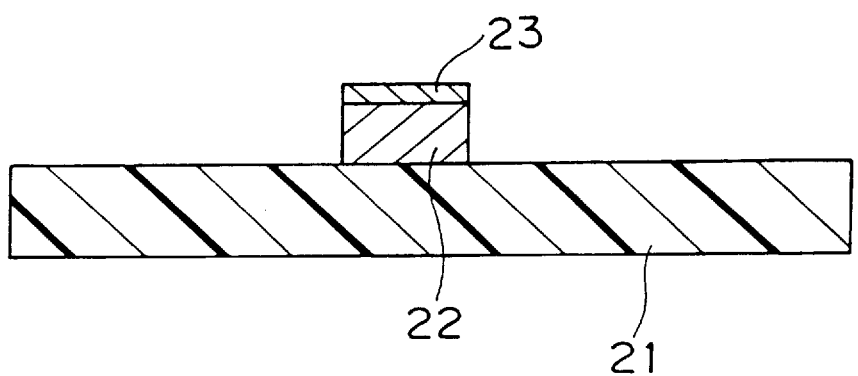

As shown in FIG. 3(a), a synthetic resin film 21 consisting of polyethylene terephthalate or the like is first prepared as a support. An electrode material is applied onto the synthetic resin film 21, to form an electrode 22. While the electrode 22 can be formed by a thin film forming method such as vapor deposition, sputtering, ion plating or plating, or by printing conductive paste, the same is preferably formed by vacuum-depositing copper and increasing its film thickness by electrically plating nickel in this embodiment.

Then, an adhesion inhibitor 23 is applied onto the electrode 22 by a gravure coater for preventing adhesion of a ceramic slurry, as shown in FIG. 3(b). According to this embodiment, the adhesion inhibitor 23 is prepared from liquid paraffin.

Figure 4:
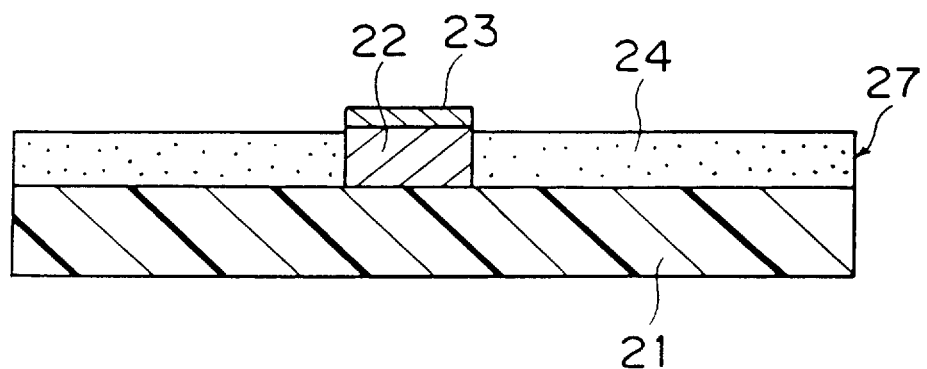
FIG. 4 is a sectional view showing a ceramic green sheet provided with a through electrode which is formed on the support film.

Then, a ceramic slurry is applied onto the support member 21 by a doctor blade coater, to form a ceramic green sheet 24. At this time, the ceramic slurry is repelled by the adhesion inhibitor 23 which is applied onto the electrode 22. Thus, the ceramic green sheet 24 is formed around the electrode 22, as shown in FIG. 4. In this case, the thickness of the ceramic green sheet 24 is preferably equivalent to or smaller than that of the electrode 22. If the ceramic green sheet 24 is larger in thickness than the electrode 22, the through electrode finally obtained may disadvantageously be buried in the ceramic layer which is formed by firing of the ceramic green sheet 24.

The adhesion inhibitor 23 must be made of a material which can prevent adhesion of the ceramic slurry and will not finally remain in a ceramic sintered body.

Figure 5:
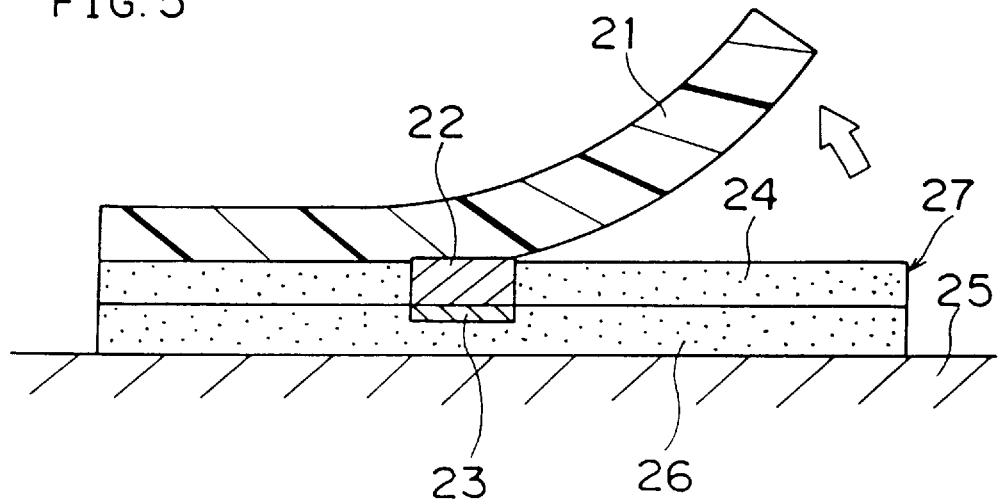
FIG. 5 is a sectional view for illustrating steps of stacking the ceramic green sheet provided with a through hole.

Then, a blank ceramic green sheet 26 is stacked on a stacking stage 25, and a ceramic green sheet 27 provided with a through electrode which is supported on the support film 21 is thereafter stacked on the ceramic green sheet 26 so that the ceramic green sheet 24 faces the same, as shown in FIG. 5. Thereafter the ceramic green sheets 24 and 26 are pressurized along the thickness direction so that the ceramic green sheet 24 is compression-bonded to the ceramic green sheet 26, and thereafter the support film 21 is separated.

Figure 6:
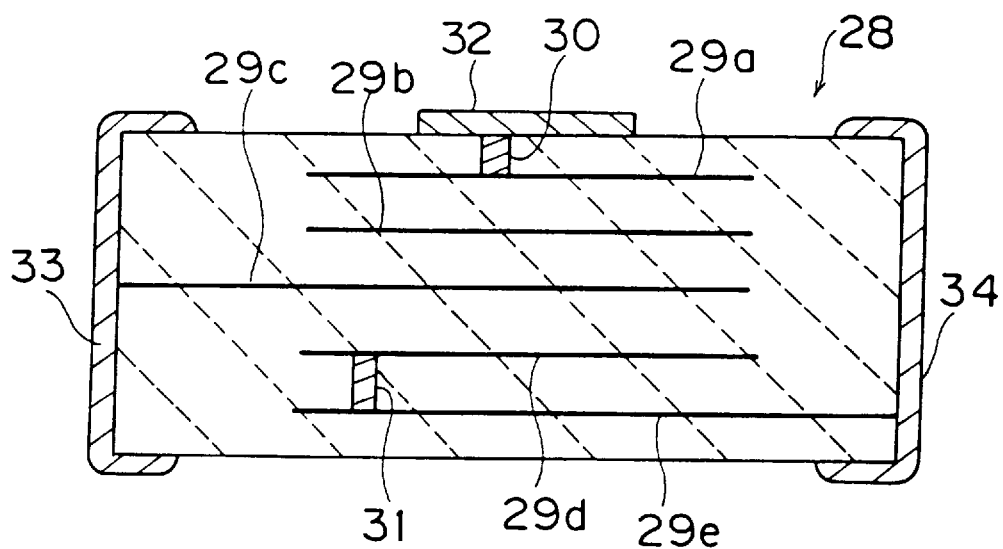
FIG. 6 is a sectional view showing a ceramic multilayer substrate obtained by a method according to an embodiment of the present invention.

The ceramic green sheet 27 provided with a through electrode, a ceramic green sheet (not shown) simply provided with an internal electrode, a blank ceramic green sheet (not shown) etc. are stacked on the stacking stage 25 in the aforementioned manner, to obtain a laminate. This laminate is pressurized along its thickness and thereafter fired, to obtain a sintered body 28 shown in FIG. 6, for example. In this sintered body 28, internal electrodes 29a to 29e are formed in different vertical positions. Further, via hole electrodes 30 and 31 consisting of the aforementioned electrodes 22 are formed in the sintered body 28. Numeral 32 denotes a wiring electrode which is formed on the upper surface of the sintered body 28. Numerals 33 and 34 denote external electrodes, which are electrically connected with proper ones of the internal electrodes 29a to 29e.

The aforementioned stacking, pressurizing, firing and external electrode forming steps can be carried out in accordance with a method of manufacturing a multilayer ceramic electronic component which is well known in the art.

According to this embodiment, the electrode 22 is formed on the support film 21, thereafter the adhesion inhibitor 23 is formed thereon and the ceramic green sheet is further formed thereon in order to form each of the via hole electrodes 30 and 31, whereby the ceramic green sheet provided with a through electrode can be readily obtained. Thus, the steps can be remarkably simplified as compared with those for manufacturing a conventional multilayer ceramic electronic component having via hole electrodes.

Figure 7:
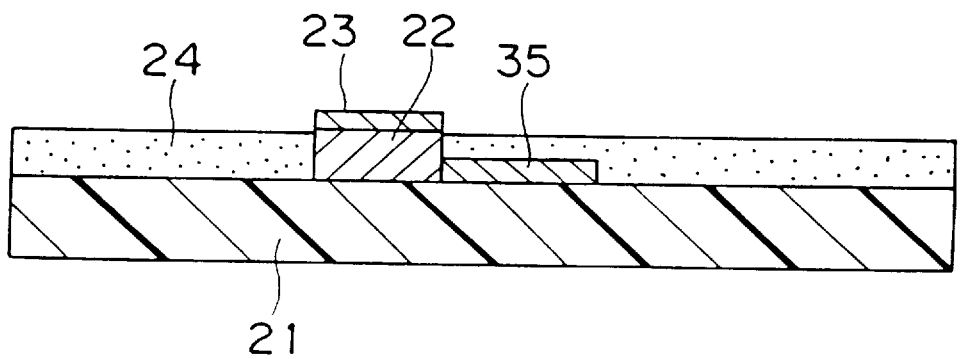
FIG. 7 is a sectional view for illustrating another example of the ceramic green sheet provided with a through electrode.

While only the electrode 22 is formed in the ceramic green sheet 24 for forming a through electrode in the aforementioned embodiment, another electrode 35 may also be formed in the ceramic green sheet 24, as shown in FIG. 7. This electrode 35 is smaller in thickness than the electrode 22 for forming the through electrode, i.e., smaller than the ceramic green sheet 24 in thickness. The adhesion inhibitor 23 is not applied to the upper surface of this electrode 35. When the ceramic green sheet 24 is formed therefore, the upper surface of the electrode 35 is covered with the ceramic green sheet 24.

Thus, the electrode 35 which is smaller in thickness than the ceramic green sheet 24 can also be formed. In this case, the electrode 35 can be formed as a wiring part or a functional electrode for an electronic component element.

The through electrode 22 and the electrode 35 may be integrally formed from the same material to be in series with each other. While the through electrode 22 and the electrode 35 are in contact with each other in FIG. 7, these electrodes may alternatively be separated from each other.

While the above embodiment has been described with reference to a via hole electrode or a through hole electrode for connecting electrodes of a multilayer ceramic component with each other, the present invention is not restricted to this but it is also possible to form an internal electrode pattern of a multilayer inductor, a multilayer ceramic capacitor or a multilayer filter itself by the inventive method.

Although embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. A method of forcing a through electrode passing through a ceramic green sheet and electrically connected to another electrode disposed adjacent to a surface of said ceramic green sheet, comprising the steps of:
    applying an electrode material onto a support for forming said through electrode;
    forming an adhesion inhibitor on at least part of said through electrode for preventing adhesion of a ceramic slurry to the through electrode;
    applying a ceramic slurry onto said support for forming a ceramic green sheet in a region around said through electrode, thereby obtaining a ceramic green sheet being provided with a through electrode passing through the same; and
    disposing another electrode adjacent to a surface of said ceramic green sheet and electrically connected to said through electrode at said surface of said ceramic green sheet.

2. The method of forming an electrode on a ceramic green sheet in accordance with claim 1, wherein said through electrode is formed by a thin film forming method.

3. The method of forming an electrode on a ceramic green sheet in accordance with claim 1, wherein the thickness of said ceramic green sheet is equivalent to or smaller than that of said electrode.

4. A method of forming an electrode on a ceramic green sheet in accordance with claim 1, further comprising the step of forming said another electrode on another ceramic green sheet prior to disposing said another electrode adjacent to said surface of said ceramic green sheet.

5. A method of forming an electrode on a ceramic green sheet in accordance with claim 1, wherein said adhesion inhibitor is formed on substantially an entire upper surface of said electrode material.

6. A method of forming an electrode on a ceramic green sheet in accordance with claim 1, further comprising the step of removing said ceramic green sheet, with the through electrode thereon, from said support.

7. A method of forming an electrode on a ceramic green sheet in accordance with claim 1, further comprising the step of selecting an adhesion inhibitor material which is incompatible with ceramic slurry and which scatters when said ceramic green sheet is fired.

8. A method of manufacturing a multilayer ceramic electronic component including a through electrode passing through a ceramic green sheet and electrically connected to another electrode disposed adjacent to a surface of said ceramic green sheet, comprising the steps of:
    applying an electrode material onto a support for forming said through electrode;
    forming an adhesion inhibitor on at least part of said through electrode for preventing adhesion of a ceramic slurry to the through electrode;
    applying a ceramic slurry onto said support for forming a ceramic green sheet in a region around said through electrode, thereby obtaining a ceramic green sheet being provided with a through electrode passing through the same; and
    disposing another electrode adjacent to a surface of said ceramic green sheet and electrically connected to said through electrode at said surface of said ceramic green sheet;
    stacking said ceramic green sheet being provided with a through electrode with another ceramic green sheet, for obtaining a ceramic laminate; and
    firing said ceramic laminate.

9. A method of manufacturing a multilayer ceramic electronic component in accordance with claim 8, further comprising the step of forming said another electrode on said another ceramic green sheet prior to disposing said another electrode adjacent to said surface of said ceramic green sheet.

10. The method of forming an electrode on a ceramic green sheet in accordance with claim 8, wherein said through electrode is formed by a thin film forming method.

11. The method of forming an electrode on a ceramic green sheet in accordance with claim 8, wherein a plurality of electrodes having different thicknesses including said through electrode, are formed on said support, and said adhesion inhibitor is not formed on said electrodes having a relatively small thickness, said adhesion inhibitor being formed on said electrodes having a relatively large thickness.

12. The method of forming an electrode on a ceramic green sheet in accordance with claim 11, wherein said electrodes having relatively small and large thicknesses are integrally formed of the same material and are in series with each other.

13. The method of forming an electrode on a ceramic green sheet in accordance with claim 8, wherein the thickness of said ceramic green sheet is equivalent to or smaller than that of said electrode.

14. The method of forming an electrode on a ceramic green sheet in accordance with claim 8, wherein said adhesion inhibitor is at least one selected from the group consisting of paraffin, silicon oil and fluororesin.

15. A method of forming an electrode on a ceramic green sheet in accordance with claim 8, wherein said adhesion inhibitor is formed on substantially an entire upper surface of said electrode material.

16. A method of forming an electrode on a ceramic green sheet in accordance with claim 8, further comprising the step of removing said ceramic green sheet, with the through electrode thereon, from said support.

17. A method of forming an electrode on a ceramic green sheet in accordance with claim 8, further comprising the step of selecting an adhesion inhibitor material which is incompatible with ceramic slurry and which scatters when said ceramic green sheet is fired.

18. A method of forming an electrode on a ceramic green sheet, comprising the steps of:

applying an electrode material onto a support for forming an electrode;

forming an adhesion inhibitor on at least part of said electrode for preventing adhesion of a ceramic slurry to the electrode; and applying a ceramic slurry onto said support for forming a ceramic green sheet on a region around said electrode, thereby obtaining a ceramic green sheet being provided with a through electrode passing through the same;

wherein said adhesion inhibitor is at least one selected from the group including paraffin, silicon oil and fluororesin.

19. A method of forming an electrode on a ceramic green sheet, comprising the steps of:

applying an electrode material onto a support for forming an electrode;

forming an adhesion inhibitor on at least part of said electrode for preventing adhesion of a ceramic slurry to the electrode; and applying a ceramic slurry onto said support for forming a ceramic green sheet on a region around said electrode, thereby obtaining a ceramic green sheet being provided with a through electrode passing through the same;

wherein a plurality of electrodes having different thicknesses, including said through electrode, are formed on said support and said adhesion inhibitor is not formed on said electrodes having a relatively small thickness, said adhesion inhibitor being formed on said electrodes having a relatively large thickness.

20. The method of forming an electrode on a ceramic green sheet in accordance with claim 19, wherein said electrodes having relatively small and large thicknesses are integrally formed of the same material and are in series with each other.

* * * * *